(12) United States Patent
Jippo

(10) Patent No.: US 6,357,033 B1
(45) Date of Patent: Mar. 12, 2002

(54) COMMUNICATION PROCESSING CONTROL APPARATUS AND INFORMATION PROCESSING SYSTEM HAVING THE SAME

(75) Inventor: Akira Jippo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/262,337

(22) Filed: Mar. 4, 1999

(30) Foreign Application Priority Data

Mar. 6, 1998 (JP) .......................................... 10-055535

(51) Int. Cl.[7] .............................................. H03M 13/00
(52) U.S. Cl. ...................... 714/758; 714/798
(58) Field of Search ...................... 708/404; 709/400; 712/28, 11; 714/11, 758, 798; 700/29; 370/220; 399/8

(56) References Cited

U.S. PATENT DOCUMENTS

| | | | | |
|---|---|---|---|---|
| 4,543,651 A | * | 9/1985 | Chang | 370/220 |
| 4,791,590 A | * | 12/1988 | Ku et al. | 708/404 |
| 4,937,741 A | * | 6/1990 | Harper et al. | 709/400 |
| 5,685,010 A | * | 11/1997 | Yoda | 712/28 |
| 5,838,894 A | * | 11/1998 | Horst | 714/11 |
| 5,857,111 A | * | 1/1999 | Oda | 712/11 |
| 6,049,738 A | * | 4/2000 | Kayama et al. | 700/29 |
| 6,112,035 A | * | 8/2000 | Kuroyanagi et al. | 399/8 |

FOREIGN PATENT DOCUMENTS

| | | |
|---|---|---|
| JP | 4-070231 | 3/1992 |
| JP | 4-301946 | 10/1992 |
| JP | 4-365238 | 12/1992 |
| JP | H5-063683 | 3/1993 |
| JP | H5-176017 | 7/1993 |
| JP | 5-308399 | 11/1993 |
| JP | 7-030616 | 1/1995 |
| JP | 7-240770 | 9/1995 |
| JP | 7-288564 | 10/1995 |

* cited by examiner

*Primary Examiner*—David Ton
(74) *Attorney, Agent, or Firm*—Sughrue Mion, PLLC

(57) ABSTRACT

A communication processing control apparatus for controlling data transmission between an arithmetic processing control apparatus and a network includes first and second communication processing sections, and a data control section. The first and second communication processing sections are made duplex and inserted into a duplex data transmission route to perform the same processing. The data control section adds CRC data to input data, and outputs the data to the first and second communication processing sections, and simultaneously checks the CRC data contained in output data from the first and second communication processing sections to detect a fault in the first and second communication processing sections.

21 Claims, 4 Drawing Sheets

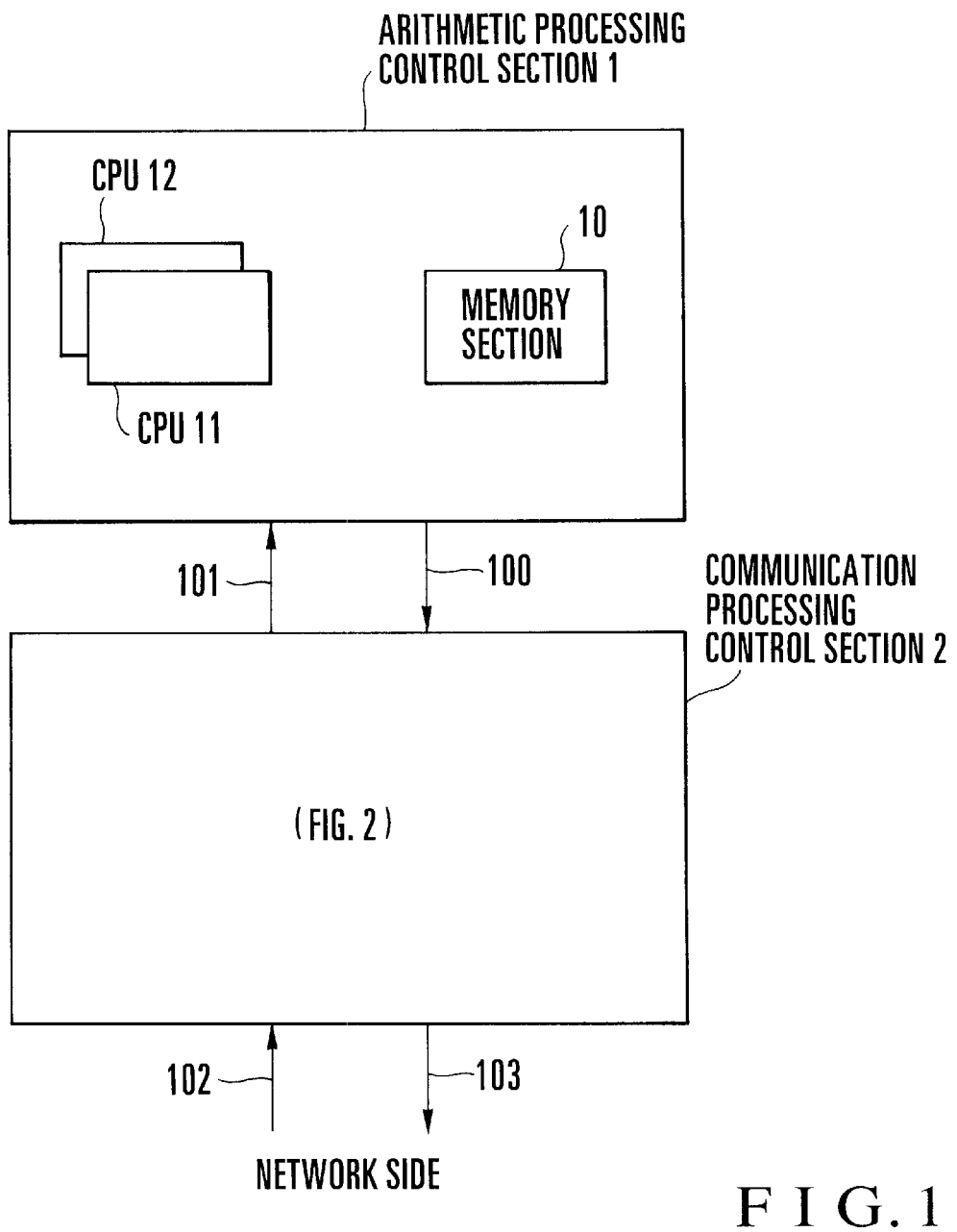
F I G. 1

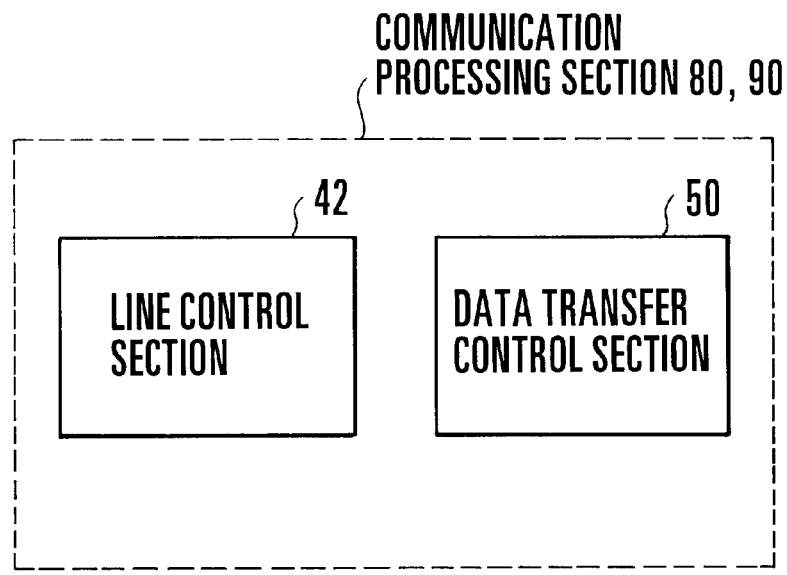
F I G. 3
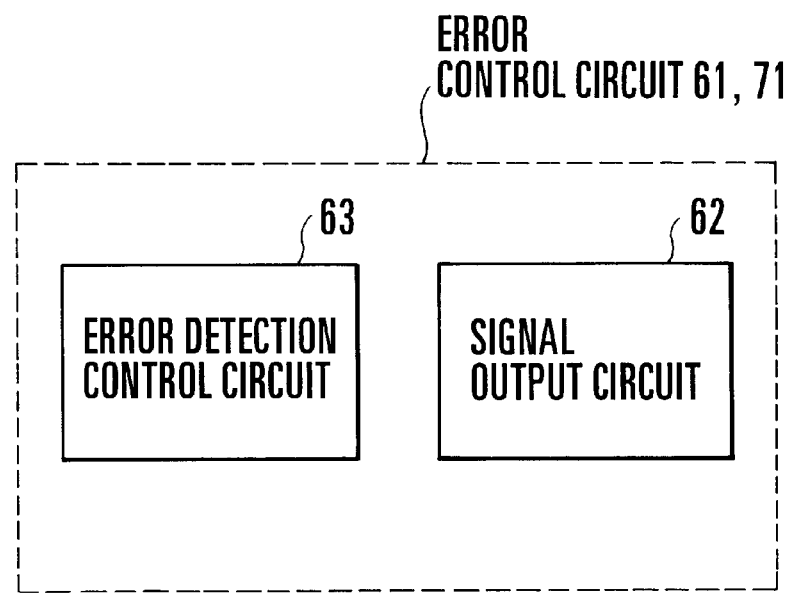
F I G. 4

COMMUNICATION PROCESSING CONTROL APPARATUS AND INFORMATION PROCESSING SYSTEM HAVING THE SAME

BACKGROUND OF THE INVENTION

The present invention relates to a fault processing apparatus and, more particularly, to a communication processing control apparatus having a duplex communication processing section in an information processing system.

As industrial classification becomes unclear and client services for 24 hours a day and 365 days a year are becoming popular, requirements for open systems, networking, and high reliability are increasing on the client side.

Under these circumstances, strong demands have arisen particularly for reliability of network control functions of various servers these days. Especially, requirements for non-stop operation are increasing together with the client's need.

Examples of systems with such requirements are a horse racing betting system, an air traffic control system, an international network system of trading companies and financial agencies, and a disaster prevention system for earthquake or the like.

In a conventional information processing apparatus of this type, a duplex network management apparatus is used to effectively manage the network even when the network management apparatus malfunctions. More specifically, the network management system comprises a main management apparatus for normal network management and a sub-management apparatus for backup management. Each management apparatus has an inter-management-apparatus communication control section for exchanging management states, and also a management state storage section for storing management states.

In the information processing system having this arrangement, even when the main management apparatus malfunctions, it can be switched to the sub-management apparatus to continuously perform network management without damaging the management states.

However, in the above-described prior art, the following social problem may occur.

In the above-described prior art, when the main management apparatus malfunctions, the main management apparatus is switched to the sub-management apparatus. For this switching, fault processing by hardware (HW) or software (SW) is performed. For this reason, a fault processing time is required to switch the main management apparatus to the sub-management apparatus. Hence, the switching time from the main management apparatus to the sub-management apparatus is not zero.

The presence of switching time largely influences mission critical processing. In some cases, this may readily pose social problems due to system down.

SUMMARY OF THE INVENTION

It is an object of the present invention to provide a communication processing control apparatus and information processing system which eliminate the management apparatus switching time when a fault occurs.

It is another object of the present invention to provide a highly reliable communication processing control apparatus and information processing system which can properly continue processing even for mission critical processing.

In order to achieve the above objects, according to the present invention, there is provided a communication processing control apparatus for controlling data transmission between an arithmetic processing control apparatus and a network, comprising first and second communication processing means, made duplex and inserted into a duplex data transmission route, for performing the same processing, and data control means for adding CRC data to input data, and outputting the data to the first and second communication processing means, and simultaneously checking the CRC data contained in output data from the first and second communication processing means to detect a fault in the first and second communication processing means.

BRIEF DESCRIPTION OF THE DRAWINGS

FIG. 1 is a block diagram showing the schematic arrangement of an information processing apparatus according to an embodiment of the present invention;

FIG. 3 is a block diagram of a communication processing section shown in FIG. 2;

FIG. 4 is a block diagram of an error control circuit shown in FIG. 2; and

DESCRIPTION OF THE PREFERRED EMBODIMENT

The present invention will be described below with reference to the accompanying drawings.

An information processing system according to the first embodiment of the present invention comprises an arithmetic processing control section 1 for controlling arithmetic processing of information, and a communication processing control section 2 for controlling data transmission between the arithmetic processing control section 1 and a network, as shown in FIG. 1. The arithmetic processing control section 1 has a plurality of central processing units (to be referred to as CPUs hereinafter) 11 and 12 for performing arithmetic processing of information, and a memory section 10 for storing an arithmetic processing result. The communication processing control section 2 is connected to the arithmetic processing control section 1 through signal lines 100 and 101 and to the network through signal lines 102 and 103.

Figure 2:
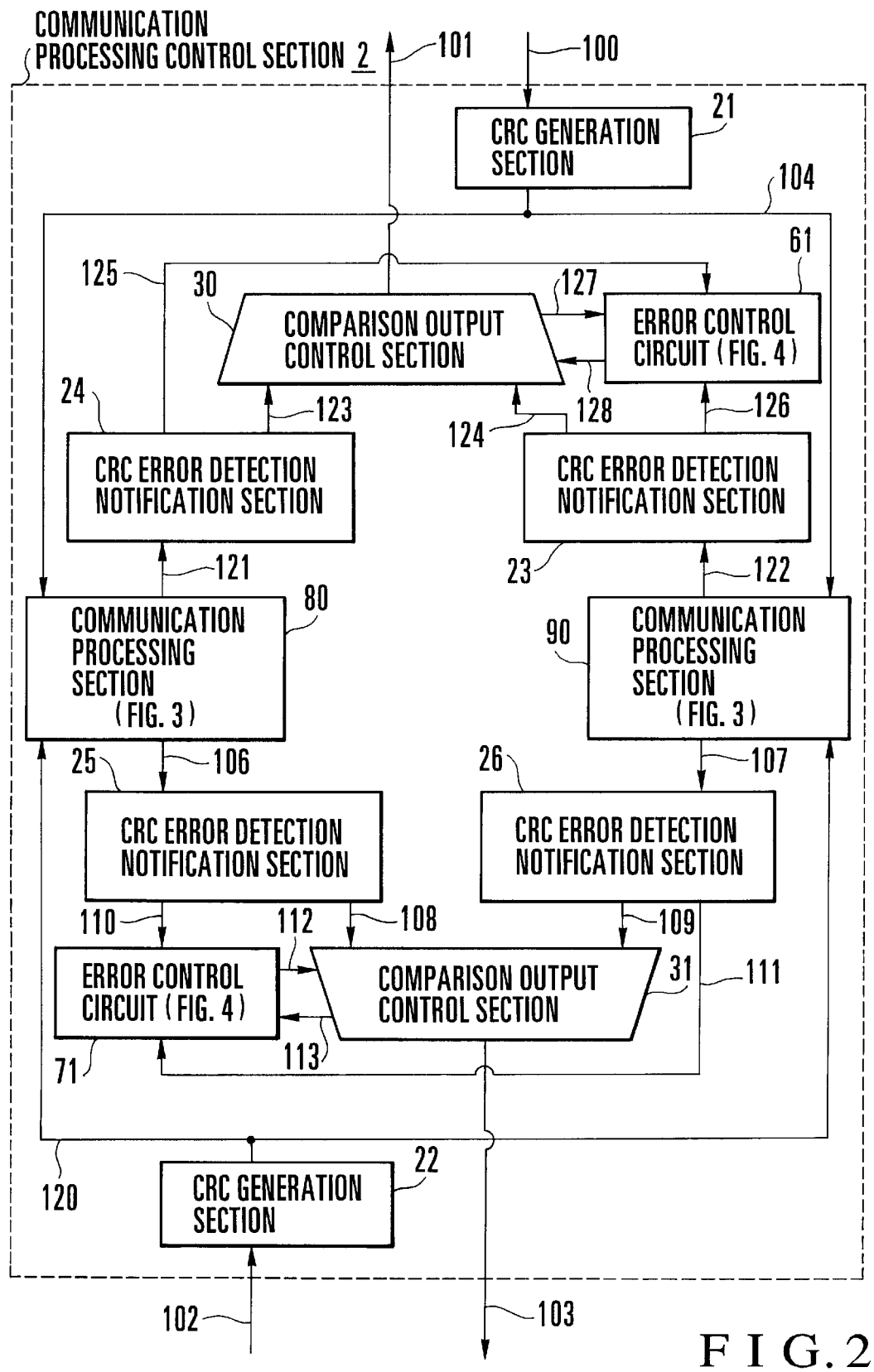
FIG. 2 is a block diagram of a communication processing control section shown in FIG. 1.

As shown in FIG. 2, the communication processing control section 2 comprises CRC (Cyclic Redundancy Check) generation sections 21 and 22, communication processing sections 80 and 90, and CRC error detection notification sections 23 to 26, comparison output control sections 30 and 31, and error control circuits 61 and 71.

The CRC generation section 21 generates CRC data and adds the generated CRC data to input data received from the arithmetic processing control section 1 through the signal line 100. Similarly, the CRC generation section 22 generates CRC data and adds the generated CRC data to input data received from the network side through the signal line 102.

The communication processing sections 80 and 90 are connected to the CRC generation sections 21 and 22 through signal lines 104 and 120, respectively. As shown in FIG. 3, each of the communication processing sections 80 and 90 has a line control section 42 and a data transfer control section 50. The communication processing sections 80 and 90 are duplex in the communication processing control section 2 and perform the same processing.

The CRC error detection notification sections 24 and 25 receive output data from the communication processing section 80 through signal lines 121 and 106, respectively, and check the presence/absence of errors on the basis of the CRC data added to the received output data. The CRC error detection notification sections 23 and 26 also receive output data from the communication processing section 90 through signal lines 122 and 107, respectively, and check the presence/absence of errors on the basis of the CRC data added to the received output data.

The CRC error detection notification sections 23 and 24 output the output data received from the communication processing sections 90 and 80 to the comparison output control section 30 through signal lines 124 and 123, respectively. The CRC error detection notification sections 25 and 26 also output the output data received from the communication processing sections 80 and 90 to the comparison output control section 31 through signal lines 108 and 109, respectively.

Upon detecting errors on the basis of the CRC data, the CRC error detection notification sections 23 and 24 notify the error control circuit 61 of the presence of errors through signal lines 126 and 125, respectively. Similarly, upon detecting errors on the basis of the CRC data, the CRC error detection notification sections 25 and 26 notify the error control circuit 71 of the presence of errors through signal lines 110 and 111, respectively.

The comparison output control section 30 receives the output data from the duplex communication processing sections 80 and 90 through the signal lines 121 and 122, CRC error detection notification sections 24 and 23, and signal lines 123 and 124, respectively, and compares the received output data. When no errors are detected upon comparison, and no error control instruction is output from the error control circuit 61, as will be described later, the output data from the duplex communication processing sections 80 and 90 are ORed and output.

In a similar way, the comparison output control section 31 receives the output data from the duplex communication processing sections 80 and 90 through the signal lines 106 and 107, CRC error detection notification sections 25 and 26, and signal lines 108 and 109, respectively, and compares the received output data. When no errors are detected upon comparison, and no error control instruction is output from the error control circuit 71, as will be described later, the output data from the duplex communication processing sections 80 and 90 are ORed and output.

Upon receiving error control instructions from the error control circuits 61 and 71, the comparison output control sections 30 and 31 select the output data from the selected one of the communication processing sections and output the data through the signal lines 101 and 103, respectively, in accordance with the received error control instructions.

When error notifications are received from the CRC error detection notification sections 23 and 24 through the signal lines 126 and 125, respectively, the error control circuit 61 issues an error control instruction through a signal line 128 to invalidate the data output from the abnormal one of the duplex communication processing sections 80 and 90, from which errors are detected, thereby controlling the comparison output control section 30. With this processing, the output data from the normal communication processing section is selected as output data of the comparison output control section 30 and output from the communication processing control section 2.

Similarly, when error notifications are received from the CRC error detection notification sections 25 and 26 through the signal lines 110 and 111, respectively, the error control circuit 71 issues an error control instruction through a signal line 112 to invalidate the data output from the abnormal one of the duplex communication processing sections 80 and 90, from which errors are detected, thereby controlling the comparison output control section 31. With this processing, the output data from the normal communication processing section is selected as output data of the comparison output control section 31 and output from the communication processing control section 2.

As shown in FIG. 4, each of the error control circuits 61 and 71 has a signal output circuit 62 for outputting an error control instruction signal to the corresponding one of the comparison output control sections 30 and 31, and an error detection control circuit 63 for recognizing an abnormal communication processing section in accordance with the error notifications from the CRC error detection notification sections 23 and 24 or 25 and 26 and notifying the signal output circuit 62 of it.

The signal output circuit 62 and error detection control circuit 63 issue an error control instruction through the signal line 128 to control the output from the comparison output control section 30 such that the output data from the abnormal communication processing section is invalidated, and only the output data from the normal communication processing section is used as the output data of the comparison output control section 30.

The CRC generation section 22, CRC error detection notification sections 23 and 24, comparison output control section 30, and error control circuit 61 constitute a first data control section. The CRC generation section 21, CRC error detection notification sections 25 and 26, comparison output control section 31, and error control circuit 71 constitute a second data control section.

Error processing for transmission data in the information processing apparatus having the above arrangement will be described next. A case wherein data input from the network side through the signal line 102 is output to the arithmetic processing control section 1 side through the signal line 101 as output data will be described below.

First, data input from the network side through the signal line 102 is input to the CRC generation section 22. The CRC generation section 22 adds CRC data to the input data and outputs the data to the communication processing sections 80 and 90 through the signal line 120.

The communication processing section 80 performs predetermined communication processing and then outputs the data to the CRC error detection notification section 24 through the signal line 121. On the other hand, the communication processing section 90 performs the same communication processing as that of the communication processing section 80 and then outputs the data to the CRC error detection notification section 25 through the signal line 122.

The CRC error detection notification section 24 outputs the data received from the communication processing section 80 to the comparison output control section 30 through the signal line 123. The CRC error detection notification section 24 also checks errors in the data received from the communication processing section 80 and outputs the check result to the error control circuit 61 through the signal line 125. Similarly, the CRC error detection notification section 23 outputs the data received from the communication processing section 90 to the comparison output control section 30 through the signal line 124. The CRC error detection notification section 23 also checks errors in the data received from the communication processing section 90 and outputs the check result to the error control circuit 61 through the signal line 126.

When no data errors are present in the output data from the communication processing sections 80 and 90, the comparison output control section 30 ORs the output data from the duplex communication processing sections 80 and 90 and outputs the data. More specifically, if it is determined that the comparison result represents matching between the output data from the communication processing sections 80 and 90, and no error control instruction is received from the error control circuit 71, the comparison output control section 30 determines that no errors are generated. On the basis of this determination result, the comparison output control section 30 ORs the output data from the duplex communication processing sections 80 and 90 and outputs the data.

However, when data errors are present in one of the output data from the communication processing sections 80 and 90, the following processing is performed.

Upon receiving error notifications from the CRC error detection notification sections 23 and 24, the error control circuit 61 issues an error control instruction to the comparison output control section 30 to invalidate the data output from the abnormal one of the duplex communication processing sections 80 and 90.

The comparison output control section 30 selects only the output data from the normal communication processing section in response to the error control instruction from the error control circuit 61 and outputs it to the arithmetic processing control section 1 side as the output data of the communication processing control section 2.

When data input from the arithmetic processing control section 1 side through the signal line 100 is to be output to the network side through the signal line 103 as output data, the CRC generation section 21, CRC error detection notification sections 25 and 26, comparison output control section 31, and error control circuit 71 perform the same operation as described above.

In this embodiment, the comparison output control sections 30 and 31 compare the output data from the communication processing sections 80 and 90. However, instead of performing comparison, the output data from the communication processing section 80 or 90 may be simply selected only in accordance with the error detection direction from the error control circuits 61 and 71 and output.

The communication processing sections 80 and 90 output data to the comparison output control sections 30 and 31 through the CRC error detection notification sections 23 to 26. However, the data may be directly output.

According to this embodiment, even when a fault occurs in one communication processing section, data from the other normal communication processing section is continuously output. A time corresponding to the time for switching the communication processing sections is not required, and data output from the communication processing control section 2 does not stop. Hence, the information processing apparatus of the present invention can solve the problem of the prior art and can be applied to even mission critical processing.

Figure 5:
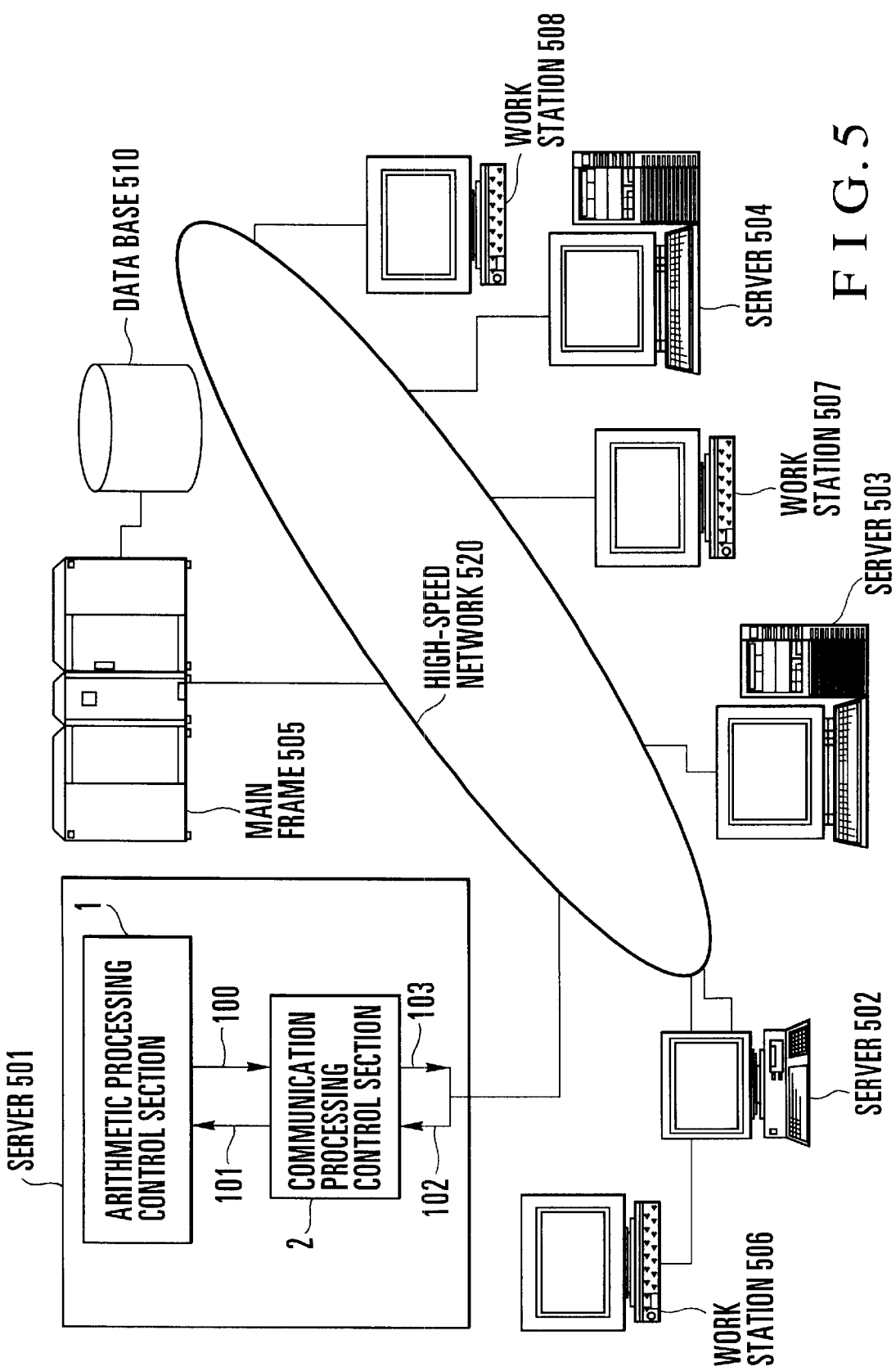
FIG. 5 is a view showing a client/server system to which the information processing apparatus of the present invention is applied as a server.

For example, the information processing apparatuses of the present invention can be applied as servers 501 to 504 in a data communication network shown in FIG. 5. The network system shown in FIG. 5 comprises the servers 501 to 504 each using the information processing apparatus shown in FIG. 1, a main frame 505, and workstations 506 to 508. The servers 501 to 504, main frame 505, and workstations 506 to 508 are connected to each other through a high-speed network 520. Additionally, a database 510 is connected to the main frame 505.

FIG. 5 shows a known network configuration. However, a network system having the information processing apparatus of the present invention, which requires no switching time, as a server can provide highly stable services as compared to conventional network systems, as is apparent from the above description.

As has been described above, according to the present invention, CRC data are generated and added to input data input to a plurality of communication processing sections provided in the communication processing control section, and the CRC data contained in the output data from the communication processing sections are monitored. With this arrangement, even when a fault occurs in one communication processing section, the fault in the duplex communication processing section can be reliably detected.

In addition, the communication processing section is made duplex, and the output results from the communication processing sections are appropriately determined. Hence, even when a fault occurs in one communication processing section, a time corresponding to the conventional apparatus switching time is not required.

Furthermore, the switching time in fault generation is unnecessary. For this reason, even when a fault occurs, continuous processing is properly ensured, so the system can be applied to even mission critical processing.

What is claimed is:

1. A communication processing control apparatus for controlling data transmission between an arithmetic processing control apparatus and a network, comprising:

first and second communication processing sections, made duplex and inserted into a duplex data transmission route, that perform the same processing; and a data control section that adds CRC data to input data, outputs the data to said first and second communication processing sections, and simultaneously checks the CRC data contained in output data from said first and second communication processing sections to detect a fault in said first and second communication processing sections, wherein said first and second communication processing sections each comprise a line control section and a data transfer control section.

2. An apparatus according to claim 1, wherein when no fault is detected, said data control section ORs the data output from said first and second communication processing sections and outputs the data, and when a fault is detected, said data control section selects only the data output from a normal one of said first and second communication processing sections and outputs the data in accordance with a CRC data check result.

3. An apparatus according to claim 2, wherein said data control section comprises:

a CRC generation section that generates the CRC data, adds the generated CRC data to output data from one of said arithmetic processing control apparatus and the network, and outputs the data to said first and second communication processing sections, first and second CRC error detection notification sections that check the CRC data contained in the output data from said first and second communication processing sections and detect in accordance with the check result whether a fault occurs in said first and second communication processing sections, an error control circuit that, when notified by said first and second CRC error detection notification sections of the fault in said first and second communication processing sections, outputs an error control instruction signal representing communication processing sections with the fault, and an output control section that, when no error control instruction signal is output from said error control circuit, ORs the output data from said first and second communication processing sections and outputs the data, and when the error control instruction signal is output from said error control circuit, outputs only the output data from a normal one of said first and second communication processing sections to the other of said arithmetic processing control apparatus and the network in accordance with the error control instruction signal.

4. An apparatus according to claim 3, wherein said output control section compares the output data from said first and second communication processing sections and control data output in accordance with a comparison result and the error control instruction signal from said error control circuit.

5. The apparatus of claim 3, said error control circuit comprising an error detection control circuit and a signal output circuit.

6. An apparatus according to claim 2, wherein said data control section comprises
   a first CRC generation section that generates the CRC data, adds the generated CRC data to output data from said arithmetic processing control apparatus, and outputs the data to said first and second communication processing sections,
   first and second CRC error detection notification sections that check the CRC data contained in the output data from said first and second communication processing sections and detect in accordance with the check result whether a fault occurs in said first and second communication processing sections,
   a first error control circuit that, when notified by said first and second CRC error detection notification sections of the fault in said first and second communication processing sections, outputs an error control instruction signal representing communication processing sections with the fault,
   a first output control section that, when no error control instruction signal is output from said first error control circuit, ORs the output data from said first and second communication processing sections and outputs the data, and when the error control instruction signal is output from said first error control circuit, outputs only the output data from a normal one of said first and second communication processing sections to the network in accordance with the error control instruction signal,
   a second CRC generation section that generates the CRC data, adds the generated CRC data to output data from the network, and outputs the data to said first and second communication processing sections,
   third and fourth CRC error detection notification sections that check the CRC data containing the output data from said first and second communication processing sections and detect in accordance with the check result when a fault occurs in said first and second communication processing sections,
   a second error control circuit that, when notified by said third and fourth CRC error detection notification sections of the fault in said first and second communication processing sections, outputs an error control instruction signal representing communication processing sections with the fault, and
   a second output control section that, when no error control instruction signal is output from said second error control circuit, ORs the output data from said first and second communication processing sections and outputs the data, and when the error control instruction signal is output from said second error control circuit, outputs only the output data from a normal one of said first and second communication processing sections to said arithmetic processing control apparatus in accordance with the error control instruction signal.

7. The apparatus of claim 1, said arithmetic processing control apparatus comprising:
   at least one central processing unit that performs arithmetic processing of information, and
   a memory that stores an arithmetic processing result by said processing unit.

8. An information processing system having an arithmetic processing control apparatus for performing arithmetic processing of information, and a communication processing control apparatus for controlling data transmission between said arithmetic processing control apparatus and a network,
   said arithmetic processing control apparatus comprising
      at least one central processing unit that performs arithmetic processing of information, and
      a memory that stores an arithmetic processing result by said central processing unit, and
   said communication processing control apparatus comprising,
      first and second communication processing sections, made duplex and inserted into a duplex data transmission route, that perform the same processing, wherein said first and second communication processing sections each comprise a line control section and a data transfer control section; and
      data control section that adds CRC data to input data, and outputs the data to said first and second communication processing sections, and simultaneously checks the CRC data contained in output data from said first and second communication processing sections to detect a fault in said first and second communication processing sections.

9. A system according to claim 8, wherein a server apparatus constituted by said information processing apparatus and a plurality of client apparatuses coupled to said server apparatus through a network comprise a client/server system.

10. A system according to claim 8, wherein when no fault is detected, said data control section ORs the data output from said first and second communication processing sections and outputs the data, and
   when a fault is detected, said data control section selects only the data output from a normal one of said first and second communication processing sections and outputs the data in accordance with a CRC data check result.

11. A system according to claim 8, wherein said data control section comprises:
   a CRC generation section that generates the CRC data, adds the generated CRC data to output data from one of said arithmetic processing control apparatus and the network, and outputs the data to said first and second communication processing sections,
   first and second CRC error detection notification sections that check the CRC data contained in the output data from said first and second communication processing sections and detect in accordance with the check result whether a fault occurs in said first and second communication processing sections,
   an error control circuit that, when notified by said first and second CRC error detection notification sections of the fault in said first and second communication processing sections, outputs an error control instruction signal representing communication processing sections with the fault, and an output control section that, when no error control instruction signal is output from said error control circuit, ORs the output data from said first and second communication processing sections and outputs the data, and when the error control instruction signal is output from said error control circuit, outputs only the output data from a normal one of said first and second communication processing sections to the other of said arithmetic processing control apparatus and the network in accordance with the error control instruction signal.

12. A system according to claim 11, wherein said output control section compares the output data from said first and second communication processing sections and control data output in accordance with a comparison result and the error control instruction signal from said error control circuit.

13. The apparatus of claim 11, said error control circuit comprising an error detection control circuit and a signal output circuit.

14. The apparatus of claim 8, wherein said first and second communication processing sections each comprise a line control section and a data transfer control section.

15. An information processing system, comprising an arithmetic processing control apparatus coupled to a communication control apparatus, said communication processing control apparatus comprising:

first and second communication processing sections, made duplex and inserted into a duplex data transmission route, that perform the same processing, wherein said first and second communication processing sections each comprise a line control section and a data transfer control section; and data control section that adds CRC data to input data, and outputs the data to said first and second communication processing sections, and simultaneously checks the CRC data contained in output data from said first and second communication processing sections to detect a fault in said first and second communication processing sections, said data control section comprising, first and second CRC error detection notification sections that check CRC data contained in output data from said first and second communication processing sections and detect in accordance with the check result whether a fault occurs in said first and second communication processing sections, and an output control section that, when an error control instruction signal is not received, ORs the output data from said first and second communication processing sections and outputs the ORed data, and when the error control instruction signal is received, outputs only the output data from a normal one of said first and second communication processing sections to the other of said arithmetic processing control apparatus and the network in accordance with the error control instruction signal.

16. The system of claim 15, further comprising:

a CRC generation section that generates the CRC data, adds the generated CRC data to output data from one of said arithmetic processing control apparatus and the network, and outputs the data to said first and second communication processing sections; and an error control circuit that, when notified by said first and second CRC error detection notification sections of the fault in said first and second communication processing sections, outputs said error control instruction signal representing communication processing sections with the fault.

17. The system of claim 16, wherein said output control section compares the output data from said first and second communication processing sections and control data output in accordance with a comparison result and the error control instruction signal from said error control circuit.

18. A communication processing control apparatus for controlling data transmission between an arithmetic processing control apparatus and a network, comprising:

first and second communication processing means, made duplex and inserted into a duplex data transmission route, for performing the same processing; and data control means for adding CRC data to input data, and outputting the data to said first and second communication processing means, and simultaneously checking the CRC data contained in output data from said first and second communication processing means to detect a fault in said first and second communication processing means, wherein said data control means comprises, a CRC generation section for generating the CRC data, adding the generated CRC data to output data from one of said arithmetic processing control apparatus and the network, and outputting the data to said first and second communication processing means, first and second CRC error detection notification sections for checking the CRC data contained in the output data from said first and second communication processing means and detecting in accordance with the check result whether a fault occurs in said first and second communication processing means, an error control circuit for, when notified by said first and second CRC error detection notification sections of the fault in said first and second communication processing sections, outputting an error control instruction signal representing communication processing means with the fault, and an output control section for, when no error control instruction signal is output from said error control circuit, ORing the output data from said first and second communication processing means and outputting the data, and when the error control instruction signal is output from said error control circuit, outputting only the output data from a normal one of said first and second communication processing means to the other of said arithmetic processing control apparatus and the network in accordance with the error control instruction signal.

19. The apparatus of claim 18, wherein when no fault is detected, said data control means ORs the data output from said first and second communication processing means and outputs the data, and when a fault is detected, said data control means selects only the data output from a normal one of said first and second communication processing means and outputs the data in accordance with a CRC data check result.

20. The apparatus of claim 18, wherein a server apparatus constituted by an information processing apparatus and a plurality of client apparatuses coupled to said server apparatus through a network comprises a client/server system.

21. The apparatus of claim 18, said arithmetic processing control apparatus comprising:

at least one central processing unit for performing arithmetic processing of information; and a memory for storing an arithmetic processing result by said central processing unit.

* * * * *